United States Patent [19]
Pinker et al.

[11] Patent Number: 5,261,999
[45] Date of Patent: Nov. 16, 1993

[54] PROCESS FOR MAKING STRAIN-COMPENSATED BONDED SILICON-ON-INSULATOR MATERIAL FREE OF DISLOCATIONS

[75] Inventors: Ronald D. Pinker, Peekskill; Emil Arnold, Chappaqua; Helmut Baumgart, Mahopac, all of N.Y.

[73] Assignee: North American Philips Corporation, New York, N.Y.

[21] Appl. No.: 697,139

[22] Filed: May 8, 1991

[51] Int. Cl.$^5$ ............................................. H01L 21/00
[52] U.S. Cl. ................................... 156/630; 156/633; 156/657; 156/662; 437/26; 437/62; 437/86; 437/132; 437/974; 252/79.1; 252/79.3
[58] Field of Search ............... 156/657, 630, 633, 662; 437/26, 62, 86, 132, 974; 252/79.3, 79.1

[56] References Cited

U.S. PATENT DOCUMENTS 5,013,681 5/1991 Godbey et al. ...................... 437/86

Primary Examiner—Thi Dang
Attorney, Agent, or Firm—Norman N. Spain

[57] ABSTRACT

A silicon-on-insulator material is formed by a method which includes the steps of forming a p-type silicon epitaxial layer, doped with boron and a higher concentration of germanium, on the surface of a semiconductor silicon substrate, forming an additional silicon epitaxial layer on the p-type silicon epitaxial layer, forming an oxide layer on the additional silicon epitaxial layer, forming an oxide layer on another semiconductor silicon substrate, forming a laminate by bringing into contact, at room temperature, the oxide layers thereby bonding together the substrates, etching the silicon substrate provided with the silicon epitaxial layers, with an isotropic etch to remove most of this silicon substrate, exposing the laminate to an anisotropic etch for this silicon substrate until the remainder of this silicon substrate is removed but only a part of the p-type epitaxial layer is removed and then exposing the resultant structure to an additional isotropic etch for the p-type epitaxial layer for a time sufficient only to remove only the remainder of the p-type epitaxial layer.

11 Claims, 1 Drawing Sheet

PROCESS FOR MAKING STRAIN-COMPENSATED BONDED SILICON-ON-INSULATOR MATERIAL FREE OF DISLOCATIONS

BACKGROUND OF THE INVENTION

The instant invention relates to a method of producing silicon-on-insulator (SOI) material. Such a material is particularly adapted for use in integrated circuit applications, such as high voltage integrated circuits where both the dielectric isolation and availability of a wide range of semiconductor thicknesses are desirable.

It is known that SOI material may be produced by the "direct silicon bonding technique". In this method, two silicon wafers are joined together to form a strong bond and then one of the wafers is thinned to desired thickness.

J. B. Lasky, Appl. Phys. Let. 48, 78 (1986) discloses such a technique. In the Lasky process, two polished Si wafers the surface of one of which or both of which may be coated with the film of silicon dioxide, are contacted to form a bonded pair. One wafer of the pair is referred to as the "handle" wafer and the other as the "device" wafer. The SOI material of the desired thickness is then obtained by thinning the device wafer to the desired thickness.

An etching technique for thinning the device wafer is shown in Maszara et al, J. Appl. Phys. 64 (10), 4943 (1988). In the method shown in the Maszara et al article, after bonding together the device and handle wafers, an ion-implanted boron doped layer is employed as an etch stop, and the device wafer is thinned down by selective chemical etching. This method results in the formation of SOI layers having a silicon layer of a thickness of 30 nm–700 nm with a thickness uniformity of ±20 nm. However, due to the high boron implant doses necessary for the production of an effective etch stop, implant damage in the form of a high density of dislocations is produced in the final SOI material.

Another method of producing an SOI film of the desired thickness consists of grinding and polishing of the device wafer, described in Electrochem Soc. Proc., Vol. 90-6, p. 61, 1990. By this method, SOI layers of a thickness of 2 microns and above with a tolerance of 0.5 microns for a thickness of 2-3 microns have been produced. However, attempts to produce an SOI layer by mechanical grinding and polishing with a better thickness tolerance have not proved to be successful.

SUMMARY OF THE INVENTION

A principal object of this invention is to provide an improved method for producing silicon-on-insulator (SOI) material that is particularly adapted for the fabrication of high voltage devices and integrated circuits with the flexibility of producing dielectrically isolated semiconductor films of various thicknesses. Another object of the invention is to provide a method for producing SOI materials that have a high thickness uniformity and are strain compensated and free of misfit dislocations.

According to the invention, an SOI material is produced by a method which comprises the following steps.

A first boron doped p-type silicon epitaxial layer having a boron concentration of above $8 \times 10^{19}$ B/cm$^3$, which is co-doped with germanium for strain compensation is formed on the surface of a first semiconductor silicon substrate (device wafer) the doping being accomplished in-situ, during epitaxial growth. A second n-type or p-type doped silicon epitaxial layer is formed on the first p-type epitaxial layer, the second epitaxial layer having a much higher resistivity than the first p-type epitaxial layer. A first oxide layer is provided on a surface of the second n-type or p-type doped silicon epitaxial layer. A second oxide layer is formed on a surface of a second semiconductor silicon substrate (handle wafer). The surfaces of both oxide layers are then hydrolyzed to promote subsequent bonding.

The two substrates are bonded together by bringing into contact, at room temperature, the first and second oxide layers thereby forming a laminated structure. The resultant laminated structure is annealed to strengthen the bond and is then exposed to a first isotropic etch for the first silicon substrate sufficient to remove most of the first semiconductor silicon substrate (device wafer). The surface of the device wafer is then exposed to a highly selective anisotropic etch until the remainder of the device wafer is removed and the etch is stopped at or near the peak concentration of boron in the p-type epitaxial layer, the etch rate of the anisotropic etch being considerably less than that of the first isotropic etch.

The structure is then exposed to a second isotropic etch to remove the remainder of the p-type epitaxial layer.

As a result, a silicon-on-insulator material (SOI) is produced, in which a thin device layer is separated from the handle wafer by an isolation oxide.

DETAILED DESCRIPTION OF THE INVENTION

Figure 1:
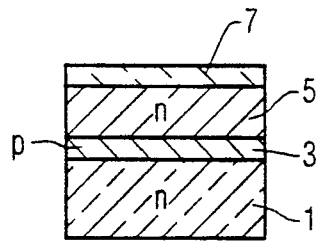
FIGS. 1–6 are cross-sectional views showing the steps in the method of the invention for producing a silicon on-insulator material.

Preferably, the device wafer has a resistivity greater than 1 ohm/cm.

Formation of the oxide layers may be carried out by any convenient means, thermal oxidation being a preferred means.

To minimize impurity interdiffusion, oxidation is preferably carried out at a temperature at or below 900° C.

The oxide layer provided on the n-doped epitaxial layer of the device wafer preferably has a thickness of at least 20 Å and the oxide layer provided on the handle wafer preferably has a thickness of about 0.5-2.5 μm.

Since the exposure to the second isotropic etch frequently results in the formation of a staining passivation layer it is desirable to expose the structure to an additional etch to remove this layer. This additional etch is a nitric acid—hydrofluoric acid etch.

Very good results have been achieved when the first isotropic etch comprises a mixture of nitric acid, hydrofluoric acid and acetic acid, the second isotropic etch comprises a mixture of nitric acid, hydrofluoric acid, hydrogen peroxide and acetic acid in a major amount and the anisotropic etch comprises a mixture of ethylene diamine, pyrazine, pyrocatechol and water.

The concentration of boron in the first epitaxial layer should be above $8 \times 10^{19}$ B/cm$^3$ and preferably between $8 \times 10^{19}$–$3 \times 10^{20}$ B/cm$^3$. In order to compensate for boron-induced lattice contraction and to suppress the formation of lattice mismatch and misfit dislocations in the boron doped epitaxial layer this layer is co-doped with germanium to an extent of a factor of 6-8 times more germanium than boron.

In order to improve the strength of the bond between the first and second oxide layers, before bonding the surfaces of these oxide layers are hydrolyzed by dipping in a sulfuric acid-hydrogen peroxide solution and in dilute hydrofluoric acid and then are subjected to treatment with nitrogen ions, produced, for example, by an ionizing spray gun, to remove charges at the surfaces of these layers and to repel all foreign particles such as dust from the oxide surfaces. Preferably, to improve the strength of the bond, the laminated structure is annealed in an oxidizing atmosphere at a temperature of 800° C.-900° C.

For a greater understanding, the invention will now be described with reference to FIGS. 1-6 of the drawing, which figures are not according to scale.

A device wafer 1 of n-type Si and having a resistivity greater than 1 ohm-cm was provided, on a polished surface thereof, with a p-type epitaxial Si layer 3 of a thickness of 0.5 μm. This p-type epitaxial layer 3 was doped with boron to a concentration of $1.5 \times 10^{20}$ B/cm$^3$ and co-doped with germanium to a concentration of $9 \times 10^{20}$ Ge/cm$^3$.

A second n-type epitaxial layer 5 of a thickness of about 5 μm and an n-type resistivity of 10-20 ohm-cm was then grown on the first p-type epitaxial layer 3. This n-type epitaxial layer 5 was doped with phosphorus to a concentration of about $5 \times 10^{14}$ P/cm$^3$. The growth conditions for growing both epitaxial layers were adjusted so as to minimize the growth of epitaxial spikes on the surface of the wafer.

The n-type epitaxial layer 5 was then thermally oxidized at a temperature of about 900° C. to form an oxide layer 7 of a thickness of 40 nm. The structure shown in FIG. 1 thereby being produced.

Figure 2:
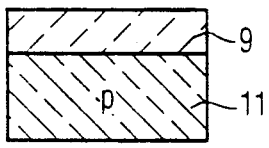

A silicon oxide layer 9 of a thickness of 1.5 μm was provided by thermal oxidation on a p-type silicon handle wafer 11. The resultant structure is shown in FIG. 2.

Figure 3:
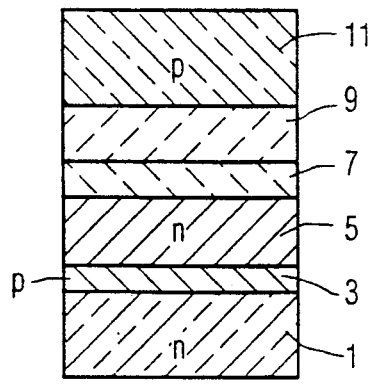

The device wafer 1 and the handle wafer 11 were then bound together at the oxide layers 7 and 9 to form the laminated structure shown in FIG. 3.

Before bonding, the oxide-coated surfaces of both wafers were hydrolyzed by dipping in a 1:1 sulfuric acid-hydrogen peroxide mixture and in a 10:1 hydrofluoric acid solution, and then sprayed with nitrogen ions from an ionizing spray gun to repel all dust and foreign particles.

Bonding was accomplished by bringing the oxide layers 7 and 9 into contact at room temperature and annealing in an oxidizing atmosphere at a temperature of 850° C. for 10 minutes.

The device wafer 1 was then thinned to a thickness of about 30 μm by etching in a mixture of about 12 parts of nitric acid, 1 part of hydrofluoric acid and 5 parts of acetic acid for about 2.5 hours. The etching rate was about 3 μm/minute.

Figure 4:
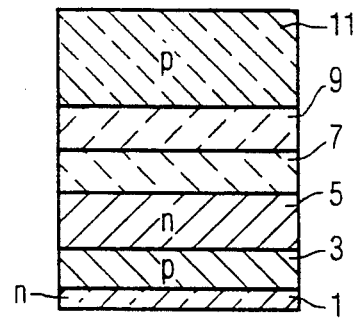

The resultant structure is shown in FIG. 4.

The structure shown in FIG. 4 was then subjected to an anisotropic etch consisting of a mixture of 17 ml ethylene diamine, 3 g pyrocatechol, 8 ml water and 10 mg pyrazine. The temperature of the etching solution was 105° C. The etch rate was about 1 μm/minute but slowed down to less than 15 Å/minute when the epitaxial layer 3 was reached at which point the etching was stopped.

Figure 5:
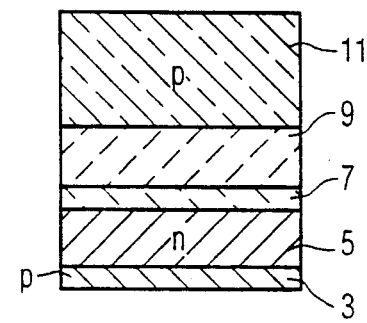

The resultant structure, shown in FIG. 5, was then subjected to a second isotropic etch to remove the remainder of the p-type epitaxial layer 3. The etching solution employed here consisted of 3 parts of nitric acid, 1 part of hydrofluoric acid, 12 parts of acetic acid and a few drops of hydrogen peroxide to provide selectivity so that the etching stopped when the n-type epitaxial layer 5 was reached.

Figure 6:
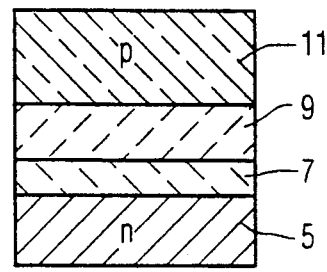

The resultant structure, shown in FIG. 6, was then subjected to an etch consisting of a 200:1 mixture of nitric acid and ammonium fluoride buffered hydrofluoric acid to remove any undesirable passivation layer found by the previous etching procedure.

What is claimed is:

1. A method of forming a silicon-on-insulator material, said method comprising forming a boron doped p-type silicon epitaxial layer having a boron concentration above $8 \times 10^{19}$ B/cm$^3$ and a co-doped germanium concentration 6-8 times higher than the boron concentration on a surface of a first semiconductor silicon substrate, forming a second silicon epitaxial layer on said p type epitaxial layer, providing a first oxide layer on a surface of said second epitaxial layer, providing a second oxide layer on a second semiconductor silicon substrate, bringing into contact said first and second oxide layers at room temperature thereby bonding together said first and second semiconductor substrates to thereby form a laminated structure, exposing said structure to a first isotropic etch for said first silicon substrate to thereby remove most of said first silicon substrate, exposing said laminate to an anisotropic etch for said first silicon substrate until the remainder of said first silicon substrate is removed, but only a part of said p-type epitaxial layer is removed and exposing said resultant structure to a second isotropic etch for said p-type epitaxial layer for a time sufficient only to remove the remainder of the said p-type epitaxial layer thereby producing a silicon-on-insulator material.

2. The method of claim 1 wherein at least one of said oxide layers is provided by thermal oxidation.

3. The method of claim 2 wherein after exposure to said second isotropic etch, said structure is exposed to a nitric acid—HF etch to remove any staining passivation layer formed by exposure to said second isotropic etch.

4. The method of claim 2 wherein said first oxide layer has a thickness of at least 20 Å.

5. The method of claim 4 wherein said first oxide layer is formed by thermal oxidation.

6. The method of claim 5 wherein said second oxide layer has a thickness of about 0.5-2.5 μm and wherein said oxide layers are subjected to treatment with nitrogen ions prior to bonding.

7. The method of claim 6 wherein the laminated structure is annealed in an oxidizing atmosphere at a temperature of 800° C.-900° C. prior to etching.

8. The method of claim 7 wherein said first isotropic etch comprises a mixture of nitric acid, hydrofluoric acid and acetic acid, the anisotropic etch comprises a mixture of ethylene diamine, pyrazine, pyrocatechol and water and the second isotropic etch comprises a mixture of nitric acid, hydrofluoric acid, hydrogen peroxide and acetic acid in a major amount.

9. The method of claim 8 wherein the first isotropic etch consists essentially of about 12 parts of nitric acid, 2 parts of hydrofluoric acid and 5 parts of acetic acid, the anisotropic etch consists essentially of a mixture of about 17 parts of ethylene diamine, 3 parts of pyrocatechol, 8 parts of water and 10 parts pyrazine and the second isotropic etch consists essentially of about 3 parts of nitric acid, 1 part of hydrofluoric acid, 12 parts of acetic acid and 0.01 parts of hydrogen peroxide.

10. The method of claim 9 wherein, after exposure to said second isotropic etch, the structure is exposed to a 200:1 mixture of acetic acid and hydrofluoric acid buffered with ammonium fluoride.

11. A method of forming a silicon-on-insulator material, said method comprising forming an in-situ boron doped p-type silicon epitaxial layer having a boron concentration above $8 \times 10^{19}$ B/cm$^3$ and a co-doped germanium concentration 6–8 times higher than the boron concentration on a surface of a first semiconductor silicon substrate, forming a second silicon epitaxial layer on said p-type epitaxial layer, providing a first oxide layer on a surface of said second epitaxial layer, providing a second oxide layer on a second semiconductor silicon substrate, hydrolyzing said oxide layers and subjecting said oxide layers to treatment with nitrogen ions, bringing into contact said first and second oxide layers at room temperature thereby bonding together said first and second semiconductor substrates to thereby form a laminated structure, exposing said structure to a first isotropic etch for said first silicon substrate to thereby remove most of said first silicon substrate, exposing said laminate to an anisotropic etch for said first silicon substrate until the remainder of said first silicon substrate is removed, but only a part of said p-type epitaxial layer is removed, and exposing said resultant structure to a second isotropic etch for said p-type epitaxial layer for a time sufficient only to remove the remainder of said p-type epitaxial layer thereby producing a silicon-on-insulator material.

* * * * *